US007030660B2

(12) United States Patent
Hanneberg et al.

(10) Patent No.: US 7,030,660 B2
(45) Date of Patent: Apr. 18, 2006

(54) LINE DRIVER

(75) Inventors: Armin Hanneberg, Haar (DE); Peter Laaser, Munich (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/483,932

(22) PCT Filed: Jun. 11, 2002

(86) PCT No.: PCT/EP02/06402

§ 371 (c)(1), (2), (4) Date: Jul. 29, 2004

(87) PCT Pub. No.: WO03/009475

PCT Pub. Date: Jan. 30, 2003

(65) Prior Publication Data

US 2004/0257114 A1 Dec. 23, 2004

(30) Foreign Application Priority Data

Jul. 18, 2001 (DE) ................................ 101 34 874

(51) Int. Cl.
*H03K 5/00* (2006.01)

(52) U.S. Cl. ........................ 326/115; 326/126; 326/127

(58) Field of Classification Search ............ 326/66–69, 326/73, 74, 77, 78, 82, 83, 86, 115, 126–127, 326/89–90

See application file for complete search history.

(56) References Cited

U.S. PATENT DOCUMENTS 5,945,847 A * 8/1999 Ransijn ...................... 326/115
5,966,382 A 10/1999 Fawal et al.
6,687,286 B1 * 2/2004 Leonowich et al. ........ 375/219
2002/0090034 A1 7/2002 Lu

FOREIGN PATENT DOCUMENTS

EP 0 078 347 A1 10/1981

OTHER PUBLICATIONS

A. Shoval, O. Shoaei, and R. Leonowich, "A Combined 10/125Mbaud Twisted-Pair Line Driver with Programmable Performance/Power Features", Session 18, Wireline Communications, 2000 IEEE International Solid-State Circuits Conference, (2 page).

(Continued)

*Primary Examiner*—Anh Q. Tran
(74) *Attorney, Agent, or Firm*—Maginot, Moore & Beck

(57) ABSTRACT

A line driver which is especially suitable for wirebound data transmission at high bit rates, comprising several parallel-connected driver stages (3) respectively comprising a first pair of transistors consisting of two transistors (4, 5) which are controlled in a differential manner according to digital data to be transmitted, and a second pair of transistors (4, 5). The transistors belonging to the second pair of transistors (6, 7) are series-connected to a corresponding transistor (4, 5) of the first pair of transistors. The individual driver stages (3) are connected by the transistors (6, 7) of the second pair of transistors in a parallel manner to both the terminals of the line driver. Each driver stage (3) is associated with a control circuit (2) with transfer gates (14, 15), producing the differential control signals ($VG_A$, $VG_B$) for the two transistors (4, 5) of the corresponding first pair of transistors.

26 Claims, 4 Drawing Sheets

OTHER PUBLICATIONS

R. Mahadevan ans D. Johns, "A Differential 160-MHz Self-Terminating Adaptive CMOS Line Driver", IEEE Journal of Solid-State Circuits, vol. 35, No. 12, Dec. 2000, (6 pages).

* cited by examiner

LINE DRIVER

CROSS-REFERENCE TO RELATED APPLICATION

This application is 371 of PCT/EP02/0602, filed on Jun. 11, 2002.

BACKGROUND AND SUMMARY

The present invention relates to a line driver for data transmission, in particular a line driver for wirebound data transmission at high bit rates.

A conventional line driver known from the prior art for wirebound data transmission is represented by way of example in FIG. 4.

As is shown in FIG. 4, the line driver comprises several parallel-connected differential pairs 3, with in each case two transistors 4, 5, wired in accordance with FIG. 4, in the present case NMOS field effect transistors, of which the source connections are connected to a power source 25, which supplies an impressed current $I_{01} \ldots I_{On}$. The drain connections of the two transistors 4, 5, which are also designated hereinafter as differential pair transistors, of each differential pair are connected to the source connections of further transistors 6 and 7 respectively, which in each case are driven by their gate connections with a bias voltage of a voltage source 8 and 9 respectively. The transistors 6 and 7 provided jointly for all differential pairs 3 form with the differential pair transistors 4 and 5 respectively in each case a cascade circuit, and are consequently also referred to hereinafter as cascade transistors. The drain connections of the cascade transistors 6, 7, are connected to the load outputs of the line driver, as is indicated in FIG. 4 in the form of (external) load resistors 12 and 13.

The differential pairs 3 are variously deflected or actuated as a function of the data of the line driver which is to be transmitted, i.e. as a function of the output signal which is to be transmitted, and drive a current onto the common cascade transistors 6, 7. The deflection or actuation of each differential pair 3 is effected by connecting the gate connections of the differential pair transistors 4, 5, to two different reference voltages $V_{ref1}$ and $V_{ref2}$ as a function of a digital word imposed, i.e. to be transmitted. To this purpose, the differential pair transistors 4, 5, are imposed by means of controllable switches 26–29, as a function of complementary control signals DW or $\underline{DW}$ respectively, optionally to the reference voltage $V_{ref1}$ and $V_{ref2}$ in such a way that the differential pair transistors 4, 5, are actuated in a differentially symmetrical manner, i.e. the gate connection of the differential pair transistor 4 is located, for example, at the reference voltage $V_{ref1}$, while at the same time the gate connection of the differential pair transistor 5 is imposed at the reference voltage $V_{ref1}$ and vice-versa. The reference voltages $V_{ref1}$ and $V_{ref2}$ are, as shown in FIG. 4, generated via a series circuit arrangement of a power source 26, which supplies an impressed current $I_{ref}$, with two further transistors 27 and 28, which are connected as represented in FIG. 4. The voltage differential $|V_{ref1}-V_{ref2}|$ determines the actuation level swing of the individual differential pairs 3.

As can be seen from FIG. 4, in the example represented all the transistors are designed in the form of NMOS field effect transistors.

One problem with the circuit arrangement shown in FIG. 4 lies in the fact that the differential pair transistors 4, 5, are actuated with a different edge gradient. The time constant $T_r$ (for a rising edge) or $T_f$ respectively (for a falling edge) of the individual actuation signal can in a first approximation be calculated as follows:

$$T_r = C_G \cdot \left(\frac{1}{g_{mref1}} + \frac{1}{g_{mref2}}\right) \quad (1)$$

$$T_f = C_G \cdot \frac{1}{g_{mref2}}$$

In this situation, $C_G$ represents the gate capacitance of the differential pair transistors 4, 5, and $g_{mrof1}$ or $g_{mrof2}$ represent the gradient of the differential pair transistors 4, 5, as a function of the reference voltage $V_{ref1}$ or $V_{ref2}$ respectively. As a result of the different time constants for a rising edge and a falling edge of the actuation signal, the differential pair transistors 4, 5, are deflected at different speeds. Accordingly, unsymmetrical edges occur at the load outputs of the line driver, as well as an AC voltage or AC signal at the foot point of the individual differential pair 3 in each case, as a result of which instances of non-linearity are incurred. This DC voltage couples via the parasitical capacitances of the current mirror circuit or cascade transistors 6, 7 onto the bias voltage provided by the voltage sources 8, 9, and therefore changes briefly the voltage provided, whereby this effect is dependent on the number of simultaneously switched differential pairs 3, and is therefore also dependent on the particular output signal of the line driver which is being sent.

The cascade transistors 6, 7, reduce the signal level swing at the drain connections of the differential pair transistors 4, 5, which as a rule are very large, and determines the load impedance for the situation in which the impedance value $R_L$ of the resistors 12, 13, is less than $1/g_{os}$, i.e. less than the reciprocal output guideline value of the cascade transistors 6, 7, this load impedance being seen from the individual differential pair 3 in each case, or which takes effect on the individual differential pair 3.

As a function of the output signal which is to be sent, a signal current of differing level flows through the cascade transistors 6, 7. Because the output guideline value $g_{DS}$ of the cascade transistors 6, 7, depends on the current IDS through the cascade transistors, a signal-dependent load takes effect on the differential pair transistors 4, 5, which leads to non-linearities.

In addition to this, when the reference voltages $V_{ref1}$ and $V_{ref2}$ are switched over, voltage peaks or spikes occur, which can likewise have a negative effect on the linearity of the line driver. Moreover, the reference voltages $V_{ref1}$ and $V_{ref2}$ created in accordance with FIG. 4 by means of diode voltages of the transistors 27, 28, fluctuate perceptibly as a function of the ambient temperature and the manufacturing process, which has a negative effect on the stability of the circuit arrangement.

The present invention is therefore based on the object of providing a line driver with improved linearity. In addition to this, the line driver should also satisfy the usual requirements such as, for example, low supply voltage and low power consumption and area coverage.

According to the invention, the line driver comprises several driver stages connected in parallel, which in each case comprise a differential pair with two transistors which are actuated in a differential manner as a function of the data which is to be transmitted. In addition to this, a separate cascade transistor pair is allocated to each differential pair, i.e. by contrast with the prior art represented in FIG. 4, the individual differential pair transistors are not connected to a common cascade transistor pair, but in each case to a separate cascade transistor pair. The individual driver stages are connected via the individual cascade transistor pairs in parallel to the load outputs of the line driver.

The summation of the currents of the individual driver stages is effected in the signal path "behind" the individual cascade transistors. Because in the deflected or actuated state, there is always a maximum current flowing through the one cascade transistor of each driver stage, and always a minimum current flowing through the other cascade transistor of the individual driver stage in each case, the load impedance of the differential pair of the individual driver stage, seen in differential consideration, is independent of the signal amplitude. This property increases the linearity of the line driver.

A further improvement in linearity can be achieved in that the differential pair transistors are actuated with the aid of a suitable preliminary stage or control circuit, in such a way that an actuation of the minimum current through one branch or transistor of the differential pair is not zero, but that a low quiescent current is flowing. It is true that an adequate linearity will be guaranteed if the minimum current through a branch is zero, but nevertheless the linearity is better with a quiescent current which differs from zero. The preliminary stage of the individual driver stage is designed in such a way that it can be adjusted relatively precisely to the common mode level and to the signal level swing, independently of each other. Because the preliminary stage allows for an independent adjustment and setting of the common mode level and of the signal level swing of the control signals for the actuation of the individual differential pair transistors in each case, an adjustable and symmetrical edge gradient of the transmission signal can be achieved; i.e. the same time constants are guaranteed for rising edges and for falling edges of the control signals, which serve to actuate the differential pair transistors in each case.

In the preliminary stages or control circuits, which in each case are provided for the actuation of the differential pair transistors of a corresponding driver stage, transfer gates are used instead of the NMOS transistors conventionally used, in order for the linearity of the switch for the deflection of the individual lift current to be increased, in order thereby to increase the symmetry of the signal edges used for the actuation of the individual differential pair transistors, and to suppress the occurrence of an AC signal at the foot point of the individual differential pair. By means of this measure too, the linearity of the transmission signal will also be increased.

Overall, therefore, it is possible with the aid of the present invention for a line driver to be created which, in addition to the usual requirements, such as low supply voltage, for example, or low power consumption and surface area, also has a high linearity and a high, adjustable, and symmetrical edge gradient of the transmission signals. In this situation, the present invention is particularly well-suited for the realisation of high-linear line drivers for a wirebound data transmission with high bit rates, for use, for example, in fast Ethernet transmission or transmission/reception devices. Naturally, however, the present invention is not restricted to this preferred scope of application, but can be applied in every situation in which high-linear transmission signals are desirable, i.e. in particular with a wireless data transmission.

The present invention is described in greater detail hereinafter by reference to the appended drawings, on the basis of a preferred embodiment.

DETAILED DESCRIPTION OF THE DRAWINGS

Figure 1:
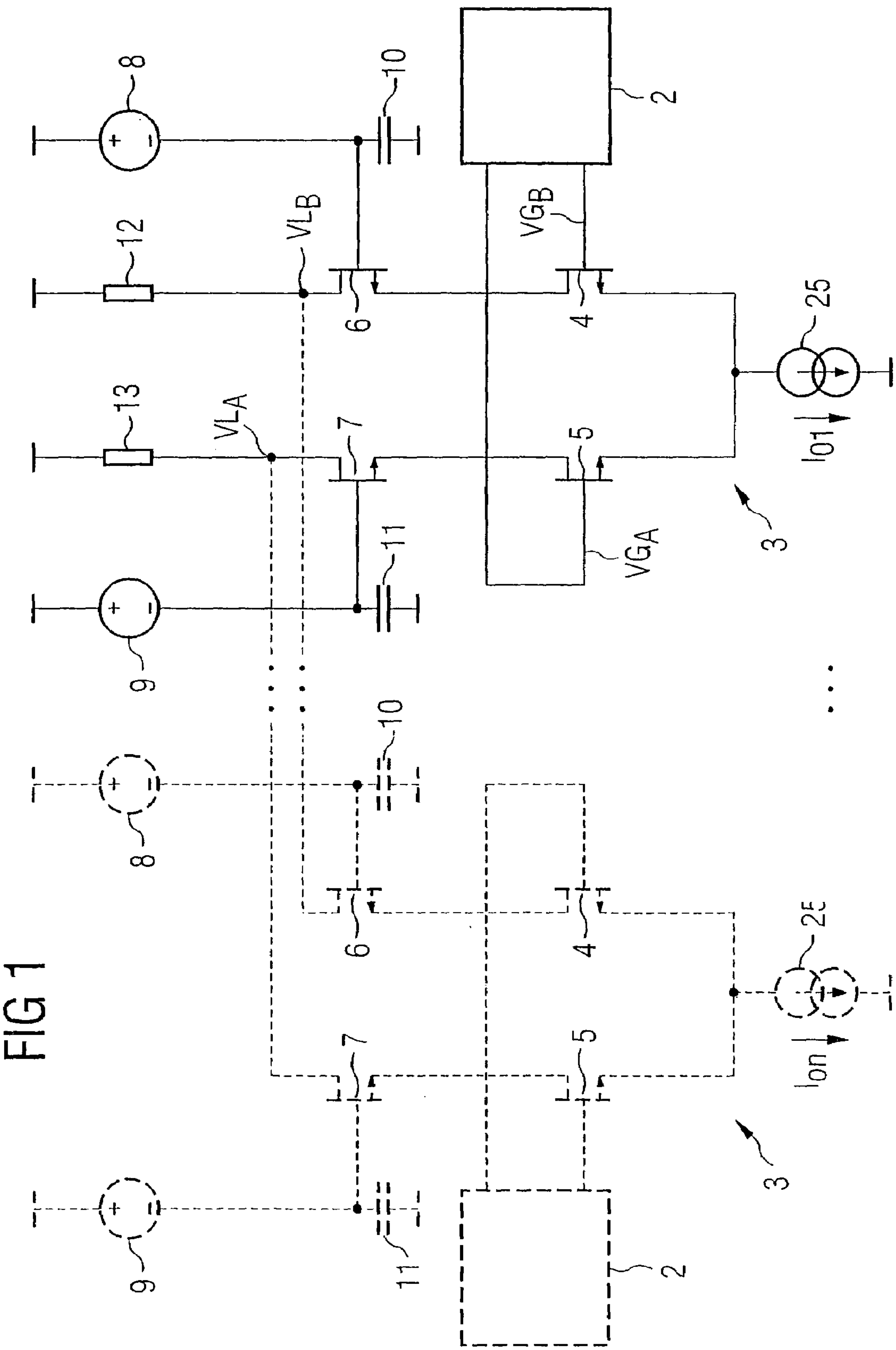
FIG. 1 shows a line driver according to a preferred embodiment of the present invention.
Figure 4:
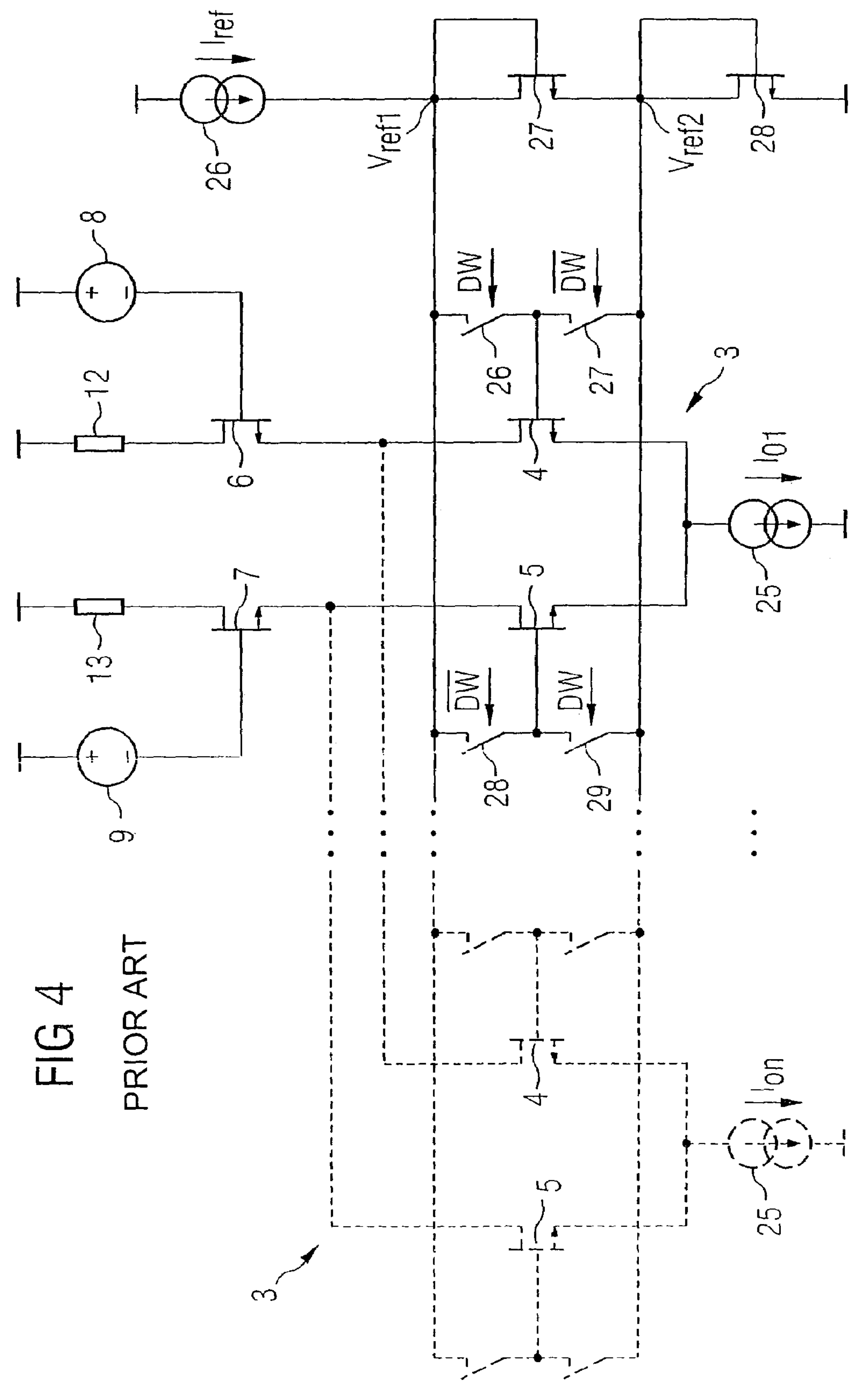
FIG. 4 shows a line driver according to the prior art.

With the line driver shown in FIG. 1, those components which correspond to the components shown in FIG. 4 have been provided with the same reference numbers, with the result that a repeated description of these components has been waived.

The line driver shown in FIG. 1 comprises several driver or output stages connected in parallel, whereby, in contrast to the conventional line driver shown in FIG. 4, each driver stage comprises not only a differential pair with two differential pair transistors 4, 5, but also in each case a separate cascade transistor pair 6, 7, at the gate connections of which, in each case, a bias voltage from a corresponding voltage source 9, 8. The individual driver stages are connected in parallel via the drain connections of the cascade transistors 6, 7, and to the outputs of the line driver or the line cores of a data transmission line connected thereto, which in FIG. 1 is indicated by load resistors 12, 13. The differential pair transistors 4, 5, of each driver stage is connected in an analogous manner to FIG. 4, i.e. their source connections are in each case connected to one another and to a power source 25, which is connected to an impressed current $I_{01}$-$I_{0n}$.

In addition to this, with the embodiment shown in FIG. 1 there are relatively large block capacitors 10, 11, for example of the order of size of 10 pF, coupled to the bias voltage line of the individual cascade transistors 6, 7, as a result of which, in addition, the linearity can be increased, since a high-frequency interfering voltage which might possibly be coupled in via parasite capacitances can be attenuated by the low-pass filtering effect which is achieved in this way.

As with the conventional line driver shown in FIG. 4, with the embodiment shown in FIG. 1 the differential pair transistors 4, 5, also actuate each differential pair 3 in a differential manner, whereby, however, by contrast with the line driver shown in FIG. 4, no controllable switches 26–29 are used in combination with NMOS transistors 27, 28, in order to connect the gate connections of the differential pair transistors 4, 5, reciprocally with two different reference voltages $V_{ref1}$ and $V_{ref2}$, but instead, with the embodiment shown in FIG. 1 a preliminary stage or control circuit 2 is allocated to each differential pair 3, this circuit producing the control voltages $VG_A$ and $VG_B$ respectively, provided for the actuation of the individual differential pair transistors 4, 5. In this situation, the control circuit 2 is preferably designed in such a way that, at the actuation of the individual differential pair 3, a maximum current flows through the one branch and through the one differential pair transistor respectively, and a minimum current through the other branch and the other differential pair transistor. This minimum current is preferably greater than zero, whereby in principle an adequate linearity is guaranteed even if the minimum current through one branch of the differential pair 3 is zero. To achieve this, the control circuit 2 is designed in such a way that it can adjust what is referred to as the "common mode" level as well as the signal level swing relatively precisely, and independently of one another.

The layout of the control circuit 2 is explained in greater detail hereinafter, by making reference to FIG. 2.

Each control circuit 2 has transfer gates 14, 15, which are actuated as a function of the data which is to be transmitted, i.e. by a digital word being imposed, with the aid of corresponding complementary control signals DW and $\underline{DW}$, with opposed polarity. The transfer gates 14 and 15 respectively therefore control the current $I_{sig}$ delivered from an adjustable current source 24, either to a right-hand resistor 19 or to a left-hand resistor 21, whereby the resistor values of the two resistors 19 and 21 are identical. The resistors 19 and 21 respectively form, together with resistors 18 and 20 respectively, a voltage divider which is driven by the impressed current $I_{cm}$ from an adjustable current source 22 or 23 respectively, whereby, as is shown in FIG. 2, at the resistor 18 or the resistor 20 respectively the control voltage $VG_B$ or $VG_A$ respectively can be tapped to actuate the differential pair transistors 4 or 5 respectively of the corresponding differential pair 3 (compare FIG. 1); i.e. a differential signal is produced ($VG_A$ or $VG_B$) for actuating the corresponding differential pair transistors 4, 5. The height of the signal level swing $|VG_A-VG_B|$ can be adjusted both by means of the current $I_{si9}$ as well as by the resistance values of the adjustable resistors 18–21.

By means of the current $I_{CM}$ and the resistance values of the resistors 18, 20, the "common mode" level can be set independently of the signal level swing referred to heretofore, whereby the common mode level $V_{CM}$ is calculated as follows:

$$V_{CM}=0.5\cdot(VG_A+VG_B) \tag{2}$$

An adjustment of the common mode level independently of the signal level swing is not possible with the circuit arrangement shown in FIG. 4.

In addition to this, by the use of the transfer gate 14, 15 instead of NMOS transistors the switch resistance can be linearised, which in turn improves the symmetry of the signal edges at the voltage potentials $VG_A/VG_B$ and $VL_A/VL_B$.

Figure 2:
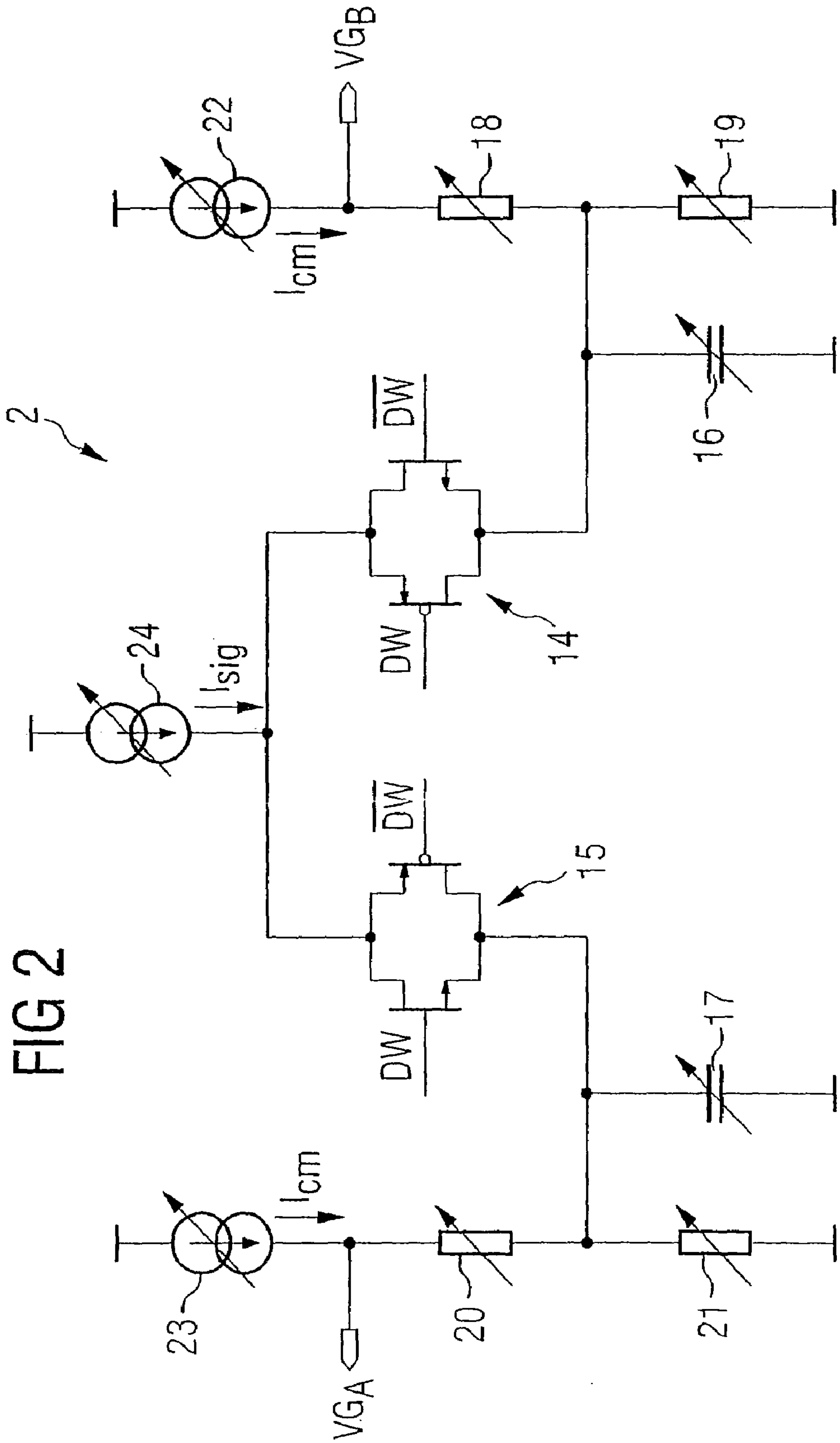
FIG. 2 shows a possible layout of a control circuit used according to FIG. 1.

With the embodiment shown in FIG. 2, adjustable capacitors 16 and 17 respectively are connected in parallel with the resistors 19 and 21 respectively. With the aid of these adjustable capacitors the edge gradient required of the control voltages $VG_B$ and $VG_B$ respectively can be regulated, which serve to actuate the differential pair transistors 4 and 5 respectively. In addition to this, process and temperature fluctuations can be compensated for by the appropriate variation of the currents $I_{CM}$ and $I_{sig}$.

The differential pair transistors 4, 5, and cascade transistors 6, 7, shown in FIG. 1 are in each case designed-preferably in the form of NMOS field effect transistors. The resistors 18–20 shown in FIG. 2 can in a general sense be interpreted as switch elements with a linear voltage/current or U/I characteristic curve respectively, and, as a result, can also be replaced by NMOS field effect transistors, which are operated in what is known as the triode range. This relates in particular to the resistors 19, 21.

With the embodiment shown in FIG. 1 and FIG. 2, the time constant for a rising and a falling signal edge is in the first approximation the same, and amounts, for example, for the case in which the capacitances 16 and 17 are in each case zero:

$$Tr=Tf=C_G\cdot(R_A+R_B) \tag{3}$$

For the situation in which the capacitances 16 and 17 are not zero, a complicated expression arises for Tr and Tf, whereby in this case Tr=Tf also applies.

In this situation, $C_G$ corresponds to the gate capacitance of the differential pair transistors 4, 5, and $R_A$ and $R_B$ respectively correspond to the resistance value of the resistors 20 and 18 respectively.

Figure 3:
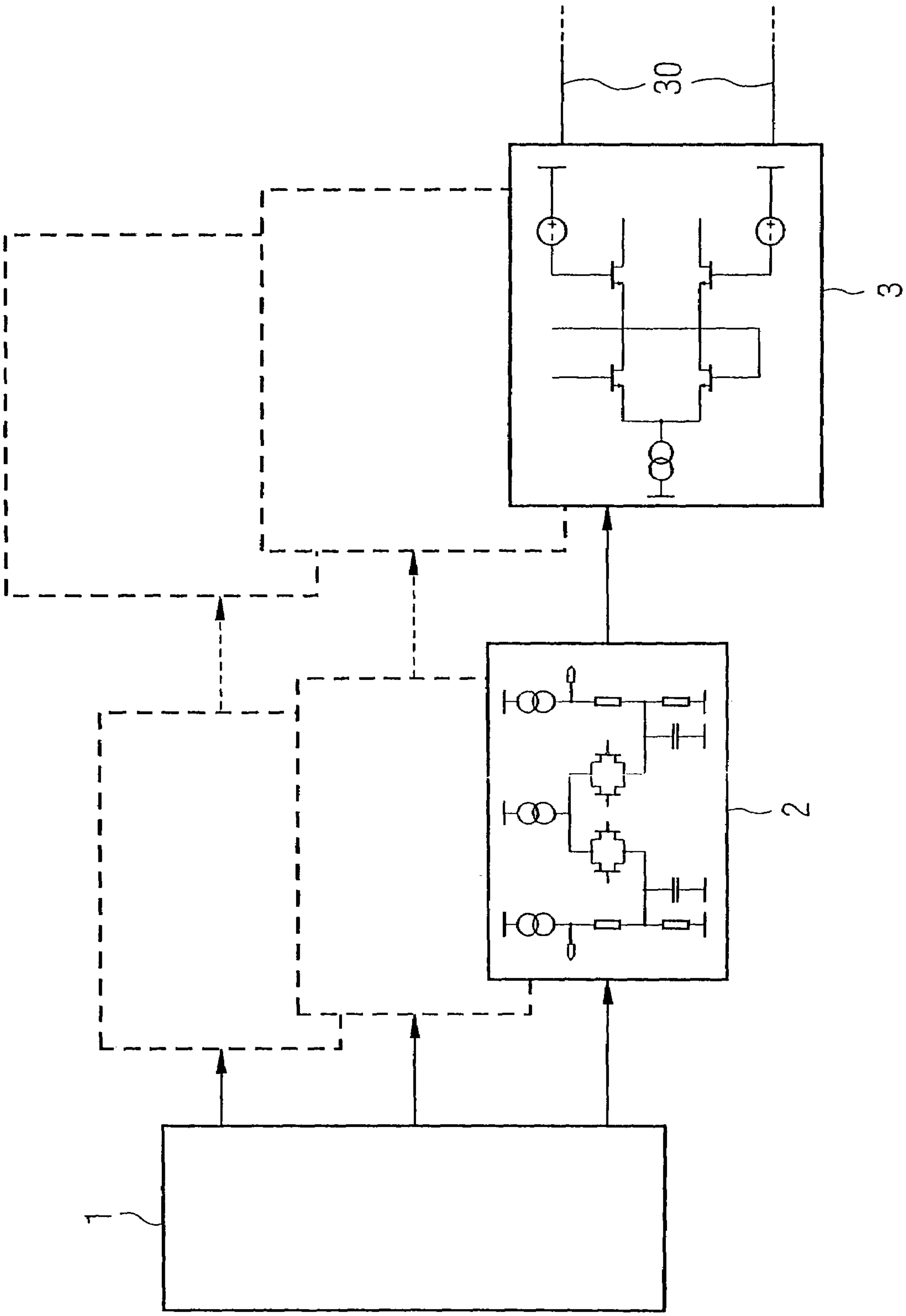
FIG. 3 shows the use of the line driver represented in FIG. 1, in a fast Ethernet transmitting device.

FIG. 3 shows a typical application of the line driver explained heretofore in FIG. 1 and FIG. 2, in a transmitter device, for example for a fast Ethernet data transmission. With the aid of a digital pulse former 1, a digital pulse pre-emphasis or filtering of the transmitted data is carried out, and the complementary digital control signals DW and $\underline{DW}$ respectively are produced for the individual control circuits 2. Depending on the desired pulse height of the transmission signal which is to be sent, some of the differential pairs 3 are switched over. The differential pairs 3 are connected with the corresponding cascade transistors to the line cores of a data transmission line 30, whereby, by means of the signal difference on the data transmission line 30, the desired signal level swing is created at the individual load resistor in each case.

The invention claimed is:

1. A line driver for data transmission comprising:

a plurality of driver stages, each driver stage comprising:

a first transistor pair with first and second transistors which are differentially actuated as a function of the data which is to be transmitted; and a second transistor pair with a first and second cascade transistor, the first cascade transistor of the second transistor pair connected in series between the first transistor of the first transistor pair of the same driver stage and a first output of the line driver, and the second cascade transistor connected in series between the second transistor of the first transistor pair of the same driver stage and a second output of the line driver, in such a way that the individual driver stages are connected in each case in parallel via the corresponding second transistor pair to the first and second outputs of the line driver; and a control circuit allocated to each driver stage for creating differential control signals ($VG_A$, $VG_B$) to actuate the two transistors of the first transistor pair of the individual driver stage, whereby each control circuit is designed in such a way that, when the differential control signals ($VG_A$, $VG_B$) are created, a specific maximum current flows via the one transistor of the first transistor pair, and a specific non-zero minimum current flows via the other transistor of the first transistor pair.

2. A line driver for data transmission comprising a plurality of driver stages, each driver stage comprising:

a first transistor pair with first and second transistors which are differentially actuated as a function of the data which is to be transmitted; and a second transistor pair with a first and second cascade transistor, the first cascade transistor of the second transistor pair connected in series between the first transistor of the first transistor pair of the same driver stage and a first output of the line driver, and the second cascade transistor connected in series between the second transistor of the first transistor pair of the same driver stage and a second output of the line driver, in such a way that the individual driver stages are connected in each case in parallel via the corresponding second transistor pair to the first and second outputs of the line driver;

a control circuit allocated to each driver stage for creating differential control signals ($VG_A$, $VG_B$) to actuate the two transistors of the first transistor pair of the individual driver stage, whereby each control circuit is designed in such a way that, when the differential control signals ($VG_A$, $VG_B$) are created, a specific maximum current flows via the one transistor of the first transistor pair, and a specific minimum current flows via the other transistor of the first transistor pair;

wherein each control circuit is designed in such a way that it can adjust the common mode level of the control signals ($VG_A$, $VG_B$) created to actuate the two transistors of the first transistor pair of the individual driver stage, independently of the signal level swing of these control signals ($VG_A$, $VG_B$).

3. A line driver for data transmission comprising a plurality of driver stages, each driver stage comprising:

a first transistor pair with first and second transistors which are differentially actuated as a function of the data which is to be transmitted; and a second transistor pair with a first and second cascade transistor, the first cascade transistor of the second transistor pair connected in series between the first transistor of the first transistor pair of the same driver stage and a first output of the line driver, and the second cascade transistor connected in series between the second transistor of the first transistor pair of the same driver stage and a second output of the line driver, in such a way that the individual driver stages are connected in each case in parallel via the corresponding second transistor pair to the first and second outputs of the line driver;

a control circuit allocated to each driver stage for creating differential control signals ($VG_A$, $VG_B$) to actuate the two transistors of the first transistor pair of the individual driver stage, whereby each control circuit is designed in such a way that, when the differential control signals ($VG_A$, $VG_B$) are created, a specific maximum current flows via the one transistor of the first transistor pair, and a specific minimum current flows via the other transistor of the first transistor pair;

wherein each control circuit comprises a pair of transfer gates, whereby each transfer gate is actuated by complementary control signals (DW, DW') as a function of the data which is to be transmitted, and optionally forwards, or not, a current ($I_{sig}$) from a current source as a function of the actuation by these control signals (DW, DW'), to a voltage divider formed by switching elements with a linear voltage/current characteristic curve, whereby at the one voltage divider the control signal ($VG_B$) is provided for the actuation of the first transistor, and at the other voltage divider the control signal ($VG_A$) is provided for the actuation of the second transistor of the first transistor pair of the corresponding driver stage.

4. The line driver according to claim 3, wherein the current source is adjustable.

5. The line driver according to claim 3, wherein the voltage dividers coupled to the transfer gates are in each case fed with the current ($I_{CM}$) from a second and third adjustable current source respectively.

6. The line driver according to claim 3, wherein each voltage divider comprises a series circuit consisting of a first switch element with a linear voltage/current characteristic curve and a second switch element with a linear voltage/current characteristic curve, whereby at the second switch elements of the voltage dividers the control signals ($VG_A$, $VG_B$) are prepared for the two transistors of the first transistor pair of the corresponding driver stage, and a node between the first switch element and the second switch element is connected to an output of the individual transfer gate in each case.

7. The line driver according to claim 6, wherein the second switch elements of the voltage dividers allocated to the two transfer gates have identical resistance values.

8. The line driver according to claim 6, wherein an adjustable capacitor is connected in parallel to the second switch elements of the voltage dividers in each case.

9. The line driver according to claim 6, wherein the switch elements are capable of being adjusted with the linear voltage/current characteristic curve of the voltage dividers.

10. A line driver for data transmission comprising a plurality of driver stages, each driver stage comprising:

a first transistor pair with first and second transistors which are differentially actuated as a function of the data which is to be transmitted; and a second transistor pair with a first and second cascade transistor, the first cascade transistor of the second transistor pair connected in series between the first transistor of the first transistor pair of the same driver stage and a first output of the line driver, and the second cascade transistor connected in series between the second transistor of the first transistor pair of the same driver stage and a second output of the line driver, in such a way that the individual driver stages are connected in each case in parallel via the corresponding second transistor pair to the first and second outputs of the line driver;

wherein the cascade transistors of the second transistor pair of each driver stage ate subjected to a bias voltage by a corresponding voltage source, which is connected to the individual cascade transistor to the second transistor pair in each case by means of a bias voltage line, whereby the bias voltage line allocated to each cascade transistor of the second transistor pair is couples to a capacitor.

11. The line driver according to claim 10, wherein the capacitors coupled to the bias voltage lines of the cascade transistors of the second transistor pair of each driver stage ate of an order of size of 10 pF.

12. The line driver according to claim 1, wherein the first and second outputs are adapted to be connected to line cores of a data transfer line.

13. The line driver according to claim 3, wherein the first and second outputs are adapted to be connected to line cores of a data transfer line.

14. The line driver according to claim 13, wherein a pulse former generates the complementary control signals (DW, DW) for the transfer gates of the control circuits of the individual driver stages.

15. The line driver according to claim 10, further comprising a control circuit allocated to each driver stage for creating differential control signals ($VG_A$, $VG_B$) to actuate the two transistors of the first transistor pair of the individual driver stage, whereby each control circuit is designed in such a way that, when the differential control signals ($VG_A$, $VG_B$) are created, a specific maximum current flows via the one transistor of the first transistor pair, and a specific minimum current flows via the other transistor of the first transistor pair.

16. The line driver according to claim 15, wherein each control circuit comprises a pair of transfer gates, whereby each transfer gate is actuated by complementary control signals (DW, DW') as a function of the data which is to be transmitted, and optionally forwards, or not, a current ($I_{sig}$) from a current source as a function of the actuation by these control signals (DW, DW'), to a voltage divider formed by switching elements with a linear voltage/current characteristic curve, whereby at the one voltage divider the control signal ($VG_B$) is provided for the actuation of the first transistor, and at the other voltage divider the control signal ($VG_A$) is provided for the actuation of the second transistor of the first transistor pair of the corresponding driver stage.

17. The line driver according to claim 16, wherein the current source is adjustable.

18. The line driver according to claim 16, wherein the voltage dividers coupled to the transfer gates are in each case fed with the current ($I_{CM}$) from a second and third adjustable current source respectively.

19. The line driver according to claim 16, wherein each voltage divider comprises a series circuit consisting of a first switch element with a linear voltage/current characteristic curve and a second switch element with a linear voltage/current characteristic curve, whereby at the second switch elements of the voltage dividers the control signals ($VG_A$, $VG_B$) are prepared for the two transistors of the first transistor pair of the corresponding driver stage, and a node between the first switch element and the second switch element is connected to an output of the individual transfer gate in each case.

20. The line driver according to claim 19, wherein the second switch elements of the voltage dividers allocated to the two transfer gates have identical resistance values.

21. The line driver according to claim 19, wherein an adjustable capacitor is connected in parallel to the second switch elements of the voltage dividers in each case.

22. The line driver according to claim 19, wherein the switch elements are capable of being adjusted with the linear voltage/current characteristic curve of the voltage dividers.

23. The line driver according to claim 1, wherein the cascade transistors of the second transistor pair of each driver stage are subjected to a bias voltage by a corresponding voltage source, which is connected to the individual cascade transistor of the second transistor pair in each case by means of a bias voltage line, whereby the bias voltage line allocated to each cascade transistor of the second transistor pair is coupled to a capacitor.

24. The line driver according to claim 23, wherein the capacitors coupled to the bias voltage lines of the cascade transistors of the second transistor pair of each driver stage are of an order of size of 10 pF.

25. The line driver according to claim 2, wherein the cascade transistors of the second transistor pair of each driver stage are subjected to a bias voltage by a corresponding voltage source, which is connected to the individual cascade transistor of the second transistor pair in each case by means of a bias voltage line, whereby the bias voltage line allocated to each cascade transistor of the second transistor pair is coupled to a capacitor.

26. The line driver according to claim 25, wherein the capacitors coupled to the bias voltage lines of the cascade transistors of the second transistor pair of each driver stage are of an order of size of 10 pF.

* * * * *